United States Patent
Byl et al.

(10) Patent No.: US 9,831,063 B2
(45) Date of Patent: Nov. 28, 2017

(54) ION IMPLANTATION COMPOSITIONS, SYSTEMS, AND METHODS

(71) Applicant: Entegris, Inc., Billerica, MA (US)

(72) Inventors: Oleg Byl, Southbury, CT (US); Joseph D. Sweeney, New Milford, CT (US); Ying Tang, Brookfield, CT (US); Richard S. Ray, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/768,758

(22) PCT Filed: Mar. 3, 2014

(86) PCT No.: PCT/US2014/019815
§ 371 (c)(1),
(2) Date: Aug. 18, 2015

(87) PCT Pub. No.: WO2014/137872
PCT Pub. Date: Sep. 12, 2014

(65) Prior Publication Data
US 2015/0380212 A1    Dec. 31, 2015

Related U.S. Application Data

(60) Provisional application No. 61/773,135, filed on Mar. 5, 2013.

(51) Int. Cl.
*H01J 37/00* (2006.01)
*H01J 37/317* (2006.01)
*H01J 37/08* (2006.01)
*H01L 21/22* (2006.01)
*C23C 14/48* (2006.01)

(52) U.S. Cl.
CPC .......... *H01J 37/3171* (2013.01); *C23C 14/48* (2013.01); *H01J 37/08* (2013.01); *H01L 21/2225* (2013.01); *H01J 2237/006* (2013.01); *H01J 2237/08* (2013.01)

(58) Field of Classification Search
CPC .... H01J 37/3171; H01J 37/08; H01J 2237/08; H01J 2237/006; H01L 21/2225
USPC .......................................... 250/492.1–492.3
See application file for complete search history.

(56) References Cited

U.S. PATENT DOCUMENTS

| 8,779,383 | B2 * | 7/2014 | Mayer | C09K 3/00 |
|---|---|---|---|---|
| | | | | 250/423 R |
| 2006/0060817 | A1 | 3/2006 | Tempel | |
| 2006/0060818 | A1 * | 3/2006 | Tempel | C01B 3/001 |
| | | | | 252/181.3 |

(Continued)

FOREIGN PATENT DOCUMENTS

WO    2007134183 A2    11/2007

OTHER PUBLICATIONS

Supplementary European Search Report & Opinion from EP14760985, dated Jan. 18, 2017, 13 pages.

*Primary Examiner* — Michael Maskell

(57) ABSTRACT

Ion implantation compositions, systems and methods are described, for implantation of dopant species. Specific selenium dopant source compositions are described, as well as the use of co-flow gases to achieve advantages in implant system characteristics such as recipe transition, beam stability, source life, beam uniformity, beam current, and cost of ownership.

8 Claims, 1 Drawing Sheet

(56) References Cited

U.S. PATENT DOCUMENTS

| | | | |
|---|---|---|---|
| 2010/0224264 A1* | 9/2010 | Homan | B01F 3/028 |
| | | | 137/93 |
| 2011/0143527 A1 | 6/2011 | Platow et al. | |
| 2012/0108044 A1 | 5/2012 | Kaim et al. | |
| 2012/0119113 A1 | 5/2012 | Colvin et al. | |
| 2014/0322903 A1* | 10/2014 | Mayer | C09K 3/00 |
| | | | 438/514 |
| 2016/0020102 A1* | 1/2016 | Byl | H01J 37/08 |
| | | | 438/22 |

* cited by examiner

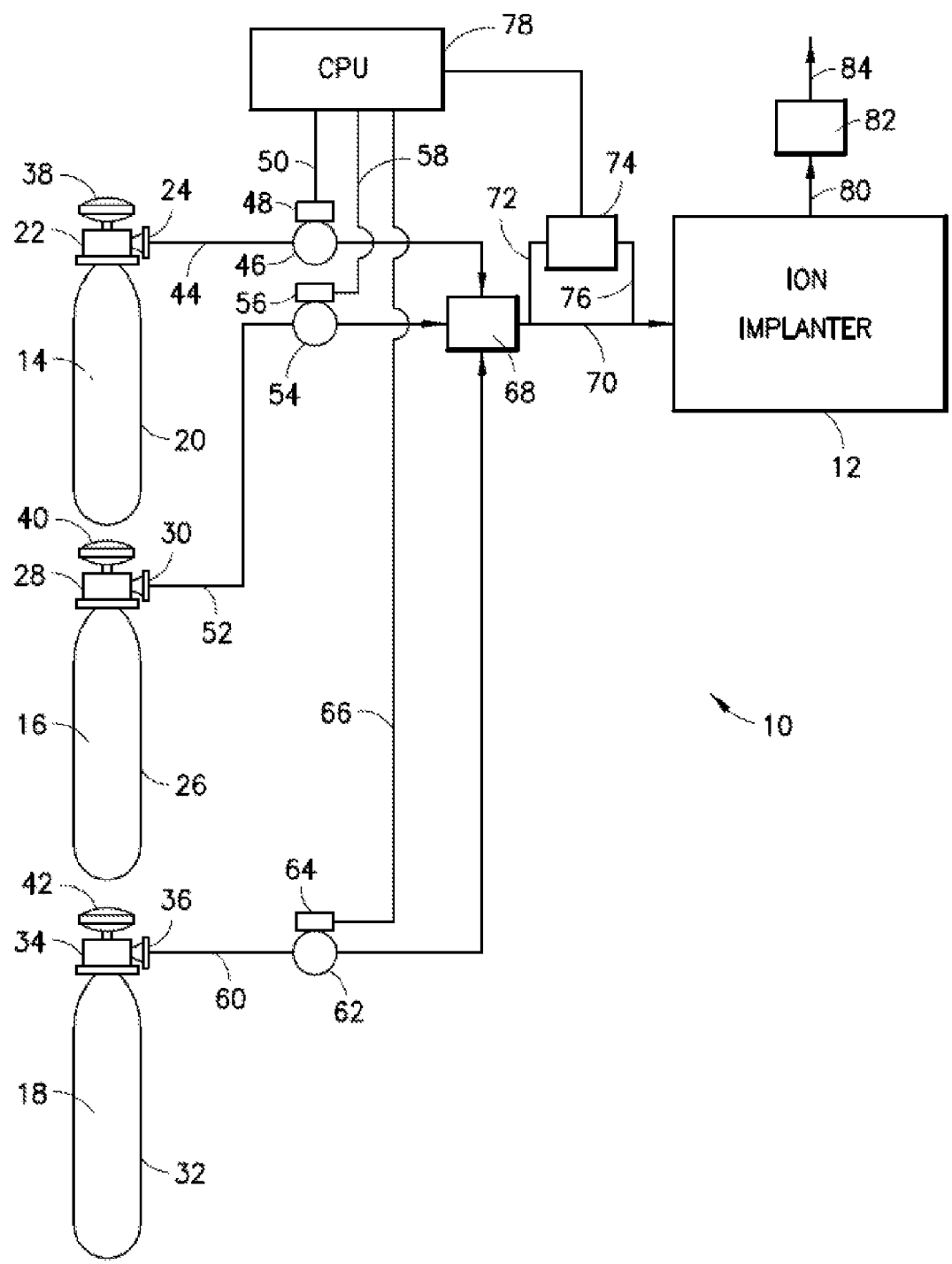

ns, and to compositions for ion implantation.
ION IMPLANTATION COMPOSITIONS, SYSTEMS, AND METHODS

CROSS-REFERENCE TO RELATED APPLICATIONS

This application is a U.S. national phase under the provisions of 35 U.S.C. §371 of International Patent Application No. PCT/US14/19815 filed Mar. 3, 2014, which in turn claims the benefit of priority under the provisions of 35 USC 119 of U.S. Provisional Patent Application No. 61/773,135 filed Mar. 5, 2013 in the name of Oleg Byl, et al. for "ION IMPLANTATION COMPOSITIONS, SYSTEMS, AND METHODS". The disclosures of such International Patent Application No. PCT/US14/19815 and U.S. Provisional Patent Application No. 61/773,135 are hereby incorporated herein by reference, in their respective entireties, for all purposes.

FIELD

The present disclosure relates to ion implantation systems and methods, and to compositions for ion implantation.

DESCRIPTION OF THE RELATED ART

Ion implantation is a widely used process in the manufacture of microelectronic and semiconductor products, being employed to accurately introduce controlled amounts of dopant impurities into substrates such as semiconductor wafers.

In ion implantation systems employed in such applications, an ion source typically is employed to ionize a desired dopant element gas, and the ions are extracted from the source in the form of an ion beam of desired energy. Various types of ion sources are used in ion implantation systems, including the Freeman and Bernas types that employ thermoelectrodes and are powered by an electric arc, microwave types using a magnetron, indirectly heated cathode (IHC) sources, and RF plasma sources, all of which typically operate in a vacuum.

In any system, the ion source generates ions by introducing electrons into a vacuum arc chamber (hereinafter "chamber") filled with the dopant gas (commonly referred to as the "feedstock gas"). Collisions of the electrons with atoms and molecules in the dopant gas result in the creation of ionized plasma consisting of positive and negative dopant ions. The extraction electrode with a negative or positive bias will respectively allow the positive or negative ions to pass through the aperture as a collimated ion beam, which is accelerated towards the target material to form a region of desired conductivity.

Frequency and duration of preventive maintenance (PM) is one performance factor of an ion implantation tool. As a general tendency the tool PM frequency and duration should be decreased. The parts of the ion implanter tool that require the most maintenance include the ion source, which is generally serviced after approximately 50 to 300 hours of operation, depending on operating conditions; the extraction electrodes and high voltage insulators, which are usually cleaned after a few hundred hours of operation; and the pumps and vacuum lines of vacuum systems associated with the tool. Additionally, the filament of the ion source is replaced on a regular basis.

Ideally, feedstock molecules dosed into an arc chamber would be ionized and fragmented without substantial interaction with the arc chamber itself or any other components of the ion implanter. In reality, feedstock gas ionization and fragmentation can results in such undesirable effects as arc chamber components etching or sputtering, deposition on arc chamber surfaces, redistribution of arc chamber wall material, etc. These effects contribute to ion beam instability, and may eventually cause premature failure of the ion source. Residues of feedstock gases and their ionization products, when deposited on the high voltage components of the ion implanter tool, such as the source insulator or the surfaces of the extraction electrodes, can also cause energetic high voltage sparking. Such sparks are another contributor to beam instability, and the energy released by these sparks can damage sensitive electronic components, leading to increased equipment failures and poor mean time between failures (MTBF).

In ion implanters that run a high percentage of hydride gases as feedstock gases or co-flow gases (co-flow gases are gases that are contemporaneously flowed to the implanter with feedstock gases, either in mixture with the feedstock gas, or as piped to the ionization chamber of the implanter in a separate flow conduit from the conduit flowing the feedstock gas), ion source failure modes typically include (i) excessive sputtering of the cathode, resulting in so-called "punch-through" of the cathode, (ii) excessive deposition of solids and insulating surfaces, resulting in electrical shorts or "glitching," (iii) solids buildup that causes shorting between two components of differing electric potential, and (iv) solids buildup on the cathode that causes loss of electron emission efficiency resulting in loss of ion beam current.

As microelectronic and semiconductor devices become progressively smaller, ion implantation is frequently required to be conducted at correspondingly lower energies to provide shallow implanted regions, and such low-energy operation carries the disadvantages of higher cost and reduced tool productivity.

Dopants used in ion implantation systems are of widely varying types, and include arsenic, phosphorus, boron, oxygen, nitrogen, tellurium, carbon, and selenium, among others. Selenium, for example, is used as a dopant in numerous ion implantation applications, including manufacture of gallium arsenide (GaAs) metal oxide semiconductor field effect transistor (MOSFET) devices, indium phosphide (InP) devices, and quantum dots in silica glass.

Regardless of the specific type of dopant that is used in an ion implantation operation, there are common objectives of ensuring that the feedstock gases are efficiently processed, that the implantation of ion species is carried out in an effective and economic manner, and that the implanter apparatus is operated so that maintenance requirements are minimized and mean time before failure of system components is maximized so that implant tool productivity is as high as possible.

SUMMARY

The present disclosure relates to ion implantation compositions, systems and methods.

In one aspect, the disclosure relates to a method for implanting selenium from a feedstock gas comprising selenium as a dopant species, said method comprising flowing the feedstock gas to an implanter with a co-flow gas that is effective to combat at least one of the ion source failure modes of (i) sputtering of the cathode, (ii) deposition of solids on insulating surfaces, and (iii) solids buildup that causes shorting between two components of differing electric potential, and (iv) solids buildup on the cathode, optionally wherein the dopant species is isotopically enriched above natural abundance in one or more isotopes thereof.

In another aspect, the disclosure relates to a method of ion implanting selenium in a substrate, comprising ionizing a selenium-containing feedstock gas to form selenium-containing ion species, and implanting selenium ions in said substrate from the selenium-containing ion species, wherein the selenium-containing feedstock gas comprises polyselenide.

In a further aspect, the disclosure relates to a method of ion implanting selenium in a substrate, comprising ionizing a selenium-containing feedstock gas to form selenium-containing ion species, and implanting selenium ions in said substrate from the selenium-containing ion species, wherein the selenium-containing feedstock gas comprises selenium dopant species in at least one of the forms of elemental selenium, hydrogen selenide, organoselenium compound, selenium halide, and polyselenide, as isotopically enriched above natural abundance in at least one selenium isotope.

A further aspect of the disclosure relates to an ion implantation system, comprising an ion implanter comprising an ionization chamber, and a feedstock gas supply package coupled in supply relationship to said ionization chamber for delivery of feedstock gas thereto, wherein the system is constructed and arranged to carry out a method according to the present disclosure.

A still further aspect of the disclosure relates to a dopant species and co-flow gas composition, comprising:
(i) a selenium dopant species, including at least one of the forms of:
   (A) elemental selenium;
   (B) hydrogen selenide;
   (C) organoselenium compound;
   (D) selenium halide;
   (E) polyselenide; and
   (F) one or more of (A)-(E), isotopically enriched above natural abundance in at least one selenium isotope; and
(ii) a co-flow gas.

A still further aspect of the disclosure relates to a gas supply kit for an ion implantation system, comprising (i) a first gas storage and dispensing vessel holding a feedstock gas or a source reagent therefor, and (ii) a second gas storage and dispensing vessel holding a co-flow gas, wherein the feedstock gas or source reagent therefor comprise a selenium dopant species, including at least one of the forms of:
   (A) elemental selenium;
   (B) hydrogen selenide;
   (C) organoselenium compound;
   (D) selenium halide;
   (E) polyselenide; and
   (F) one or more of (A)-(E), isotopically enriched above natural abundance in at least one selenium isotope.

Yet another aspect of the disclosure relates to a method of enhancing operation of an ion implantation system, comprising providing for use in the ion implantation system (i) a first gas storage and dispensing vessel holding the feedstock gas or a source reagent therefor, and (ii) a second gas storage and dispensing vessel holding a co-flow gas, wherein the feedstock gas or source reagent therefor comprise a selenium dopant species, including at least one of the forms of:
   (A) elemental selenium;
   (B) hydrogen selenide;
   (C) organoselenium compound;
   (D) selenium halide;
   (E) polyselenide; and
   (F) one or more of (A)-(E), isotopically enriched above natural abundance in at least one selenium isotope.

A further aspect of the disclosure relates to a feedstock supply package for ion implantation, comprising a storage and dispensing vessel holding a selenium dopant species selected from the group consisting of: (A) elemental selenium isotopically enriched above natural abundance in at least one selenium isotope; (B) hydrogen selenide isotopically enriched above natural abundance in at least one selenium isotope; (C) selenium halide isotopically enriched above natural abundance in at least one selenium isotope; (D) organoselenium compound isotopically enriched above natural abundance in at least one selenium isotope; and (E) polyselenide, optionally wherein the polyselenide is isotopically enriched above natural abundance in at least one selenium isotope.

Other aspects, features and embodiments of the disclosure will be more fully apparent from the ensuing description and appended claims.

BRIEF DESCRIPTION OF THE DRAWING

The FIGURE is a schematic representation of an ion implantation system illustrating modes of operation according to the present disclosure in which a selenium dopant source material is supplied to an ion implanter for implantation of selenium in a substrate.

DETAILED DESCRIPTION

The present disclosure relates to ion implantation systems, methods and compositions.

As used herein, and in the appended claims, the singular forms "a", "and", and "the" include plural referents unless the context clearly dictates otherwise.

Organo moieties of compounds herein, and organic compounds themselves, may be of any suitable type, and may for example comprise elements C, H, and optionally heteroatoms such as O, N, Si, etc. Such moieties and organic compounds of the present disclosure may have any suitable carbon number, e.g., $C_1$-$C_{12}$, or higher, in stoichiometric ratio with other elements therein.

As used herein, the identification of a carbon number range, e.g., $C_1$-$C_{12}$, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

The compounds of the present disclosure may be further specified in specific embodiments by provisos or limitations excluding specific substituents, groups, moieties or structures, in relation to various specifications and exemplifications thereof set forth herein. Thus, the disclosure contemplates restrictively defined compositions, e.g., a composition wherein $R^i$ is $C_1$-$C_{12}$ alkyl, with the proviso that $R^i \neq C_4$ alkyl when $R^j$ is silyl.

Although the present disclosure is directed primarily to implantation of selenium from a feedstock gas comprising selenium as a dopant species, it will be recognized that the methods and apparatus described herein may be utilized to corresponding advantage in implanting a dopant species from a feedstock gas comprising other dopant species, e.g., arsenic, germanium, tellurium, phosphorus, etc.

The feedstock gas in the general practice of the present disclosure may comprise the dopant species in the form of a hydride compound, a halide compound, or an organosource compound or complex, as for example an organoselenium compound or complex, in the case of selenium as the dopant source species. The organo moiety of such organosource compounds or complexes may be of any suitable type, and may for example comprise $C_1$-$C_{12}$ organo, such as $C_1$-$C_{12}$ alkyl, consistent with the foregoing description of organo substituents. Organoselenium compounds may be of the formula R'SeR" wherein each of R' and R" independently can comprise hydrogen, halide, alkyl, alkoxy, or nitrogen-containing functionality, including selenols (R'SeH), selenyl halides (R'SeX wherein X is halo (fluorine, chlorine, bromine, and iodine)), and selenoxides (R'O—SeR").

The present disclosure relates in one specific aspect to a method for implanting selenium from a feedstock gas comprising selenium as a dopant species, said method comprising flowing the feedstock gas to an implanter with a co-flow gas that is effective to combat at least one of the ion source failure modes of (i) sputtering of the cathode, (ii) deposition of solids on insulating surfaces, and (iii) solids buildup that causes shorting between two components of differing electric potential, and (iv) solids buildup on the cathode, optionally wherein the dopant species is isotopically enriched above natural abundance in one or more isotopes thereof.

In such method, the feedstock gas may comprise a hydride of the dopant species. The feedstock gas may be flowed to the implanter in mixture with the co-flow gas, or alternatively, the feedstock gas and the co-flow gas may be flowed to the implanter in separate gas flow conduits.

In one embodiment, the co-flow gas comprises at least one gas species selected from the group consisting of $H_2$, $PH_3$, $AsH_3$, $CH_4$, $GeH_4$, $SiH_4$, $H_2Se$, $NH_3$, $F_2$, $XeF_2$, $BF_3$, $SF_6$, $GeF_4$, $SiF_4$, $SeF_4$, $SeF_6$, $NF_3$, $N_2F_4$, HF, $WF_6$, $MoF_6$, Ar, Ne, Kr, Xe, He, $N_2$, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, CO, $CO_2$, compounds of the formula $X_yF_z$ wherein X is any element in stoichiometric ratio with F, $y \geq 1$, and $z \geq 1$, noble gases, gaseous compounds of the formula $C_aO_xH_yF_z$ wherein $a \geq 0$, $x \geq 0$, $y \geq 0$ and $z \geq 1$, gaseous compounds of the formula $C_xF_yH_z$ wherein $x \geq 0$, $y \geq 0$, and $z \geq 0$, and fluorine-containing gases.

In specific embodiments, the co-flow gas may be selected so that it is effective to combat sputtering of the cathode. The co-flow gas may comprise a fluorine-containing gas, e.g., a fluorine-containing gas selected from the group consisting of $F_2$, $XeF_2$, and $NF_3$. Alternatively, the co-flow gas may comprise a chlorine-containing gas, or other halogen-containing gas.

The feedstock gas may for example comprise a selenium dopant species, such as in the form of at least one of: elemental selenium; hydrogen selenide; organoselenium compound; polyselenide; and the foregoing forms isotopically enriched above natural abundance in at least one selenium isotope. When the selenium dopant species comprises an organoselenium compound, such organoselenium compound may be of the formula $R_2Se$ wherein each R is independently H or $C_1$-$C_{12}$ alkyl and at least one R is $C_1$-$C_{12}$ alkyl. When the feedstock gas comprises polyselenide as the selenium dopant species, the polyselenide may be of the formula $Se_n$ wherein n is from 2 to 8. When an isotopically enriched selenium dopant species is employed, the feedstock gas may comprise such dopant species in at least one of the forms of elemental selenium, hydrogen selenide, organoselenium compound, selenium halide, and polyselenide, as isotopically enriched above natural abundance of at least one selenium isotope, e.g., at least one of 74Se, 76Se, 77Se, 78Se, 80Se, and 82Se. In various embodiments, the isotopically enriched selenium isotope is isotopically enriched beyond natural abundance in 80Se.

The foregoing methodology may be employed for implanting the dopant species in a substrate. The substrate may comprise a wafer substrate or a precursor device structure of a device selected from the group consisting of semiconductor devices, flat-panel display devices, solar panel devices, LED devices, and supercapacitor devices.

The dopant species may be implanted by any suitable method, such as implantation of dopant species in a substrate by beam line ion implantation, or by plasma immersion ion implantation.

In various embodiments, the ion implantation method may utilize selenium dopant species and co-flow gas comprising a gas combination selected from the group consisting of:

$H_2Se+H_2$
$H_2Se+H_2+XeF_2$
$H_2Se+CH_4$
$H_2Se+CO$
$H_2Se+COF_2$
$H_2Se+COF_2+O_2+H_2$
$H_2Se+SeF_4$
$H_2Se+SeF_6$
$H_2Se+NF_3$
$H_2Se+XeF_2$
$H_2Se+F_2$.

The disclosure relates in a further aspect to a method of ion implanting selenium in a substrate, comprising ionizing a selenium-containing feedstock gas to form selenium-containing ion species, and implanting selenium ions in said substrate from the selenium-containing ion species, wherein the selenium-containing feedstock gas comprises polyselenide. In such method, the polyselenide may be of the formula $Se_n$ wherein n is from 2 to 8.

Another aspect of the disclosure relates to a method of ion implanting selenium in a substrate, comprising ionizing a selenium-containing feedstock gas to form selenium-containing ion species, and implanting selenium ions in said substrate from the selenium-containing ion species, wherein the selenium-containing feedstock gas comprises selenium dopant species in at least one of the forms of elemental selenium, hydrogen selenide, organoselenium compound, selenium halide, and polyselenide, as isotopically enriched above natural abundance of at least one selenium isotope.

The isotopically enriched selenium isotope in such method may comprise one or more of 74Se, 76Se, 77Se, 78Se, 80Se, and 82Se as the above-natural abundance isotope, e.g., 80Se as such isotope.

The disclosure contemplates an ion implantation system, comprising an ion implanter comprising an ionization chamber, and a feedstock gas supply package coupled in supply relationship to the ionization chamber for delivery of feedstock gas thereto, wherein the system is constructed and arranged to carry out a method of the disclosure.

The disclosure in another aspect relates to a dopant species and co-flow gas composition, comprising:
(i) a selenium dopant species, including at least one of the forms of:
  (A) elemental selenium;
  (B) hydrogen selenide;
  (C) organoselenium compound;
  (D) selenium halide;
  (E) polyselenide; and
  (F) one or more of (A)-(E), isotopically enriched above natural abundance in at least one selenium isotope; and
(ii) a co-flow gas.

In such composition, the selenium dopant species may be isotopically enriched above natural abundance in at least one of 74Se, 76Se, 77Se, 78Se, 80Se, and 82Se, such as 80Se.

The dopant species and co-flow gas composition in specific embodiments may comprise any of the following combinations:
$H_2Se+H_2$
$H_2Se+H_2+XeF_2$
$H_2Se+CH_4$
$H_2Se+CO$
$H_2Se+COF_2$
$H_2Se+COF_2+O_2+H_2$
$H_2Se+SeF_4$
$H_2Se+SeF_6$
$H_2Se+NF_3$
$H_2Se+XeF_2$
$H_2Se+F_2$.

The dopant species and co-flow gas composition may be constituted with the co-flow gas comprising at least one gas species selected from the group consisting of $H_2$, $PH_3$, $AsH_3$, $CH_4$, $GeH_4$, $SiH_4$, $H_2Se$, $NH_3$, $F_2$, $XeF_2$, $BF_3$, $SF_6$, $GeF_4$, $SiF_4$, $SeF_4$, $SeF_6$, $NF_3$, $N_2F_4$, HF, $WF_6$, $MoF_6$, Ar, Ne, Kr, Xe, He, $N_2$, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, CO, $CO_2$, compounds of the formula $X_yF_z$ wherein X is any element in stoichiometric ratio with F, y≥1, and z≥1, noble gases, gaseous compounds of the formula $C_aO_xH_yF_z$ wherein a≥0, x≥0, y≥0 and z≥1, gaseous compounds of the formula $C_xF_yH_z$ wherein x≥0, y≥0, and z≥0, and fluorine-containing gases.

The co-flow gas in the dopant species and co-flow gas composition may be selected to combat sputtering of the cathode, and may in various embodiments comprise a fluorine-containing gas, such as $F_2$, $XeF_2$, or $NF_3$, or a chlorine-containing gas or other halogen-containing gas.

In one embodiment of the dopant species and co-flow gas composition, the co-flow gas is selected from the group consisting of $H_2$, $PH_3$, $AsH_3$, $CH_4$, $GeH_4$, $SiH_4$, and $NH_3$. In another embodiment of such composition, the co-flow gas is selected from the group consisting of $F_2$, $XeF_2$, $BF_3$, $SF_6$, $GeF_4$, $SiF_4$, $SeF_4$, $SeF_6$, $NF_3$, HF, $WF_6$, and $MoF_6$. In yet another embodiment of such composition, the co-flow gas is selected from the group consisting of Ne, Kr, Xe, and He. In a still further embodiment of such composition, the co-flow gas is selected from the group consisting of $O_2$, $O_3$, $H_2O_2$, and $H_2O$. A still further embodiment of the composition comprises the co-flow gas is selected from the group consisting of $Cl_2$, $F_2$, $N_2$, $XeF_2$, and HCl. In another embodiment of the composition, the co-flow gas is selected from the group consisting of $F_2$, $COF_2$, $CF_4$, $MoF_6$, $B_2F_4$, $SeF_4$, $SeF_6$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, y≥1, and z≥1, and compounds of the formula $C_aO_xH_yF_z$ wherein a≥0, x≥0, y≥0 and z≥1, and compounds of the formula $C_xF_yH_z$ wherein x≥0, y≥0, and z≥0.

The disclosure relates in another aspect to a gas supply kit for an ion implantation system, comprising (i) a first gas storage and dispensing vessel holding a feedstock gas or a source reagent therefor, and (ii) a second gas storage and dispensing vessel holding a co-flow gas, wherein the feedstock gas or source reagent therefor comprise a selenium dopant species, including at least one of the forms of:
  (A) elemental selenium;
  (B) hydrogen selenide;
  (C) organoselenium compound;
  (D) selenium halide;
  (E) polyselenide; and
  (F) one or more of (A)-(E), isotopically enriched above natural abundance in at least one selenium isotope.

In one embodiment of such gas supply kit, at least one of the first and second gas storage and dispensing vessels may comprise a vessel containing a sorbent medium on which the selenium dopant species is adsorbed, and from which the selenium dopant species is desorbed under dispensing conditions. In another embodiment of such gas supply kit, at least one of the first and second gas storage and dispensing vessels comprises an internally pressure-regulated vessel comprising one or more pressure regulators in an interior volume of the vessel. In still other embodiments, at least one of the first and second gas storage and dispensing vessels may comprise a vessel containing an ionic liquid storage medium in which the selenium dopant species is stored by reversible chemical reaction.

The disclosure in another aspect relates to a method of enhancing operation of an ion implantation system, comprising providing for use in the ion implantation system (i) a first gas storage and dispensing vessel holding the feedstock gas or a source reagent therefor, and (ii) a second gas storage and dispensing vessel holding a co-flow gas, wherein the feedstock gas or source reagent therefor comprise a selenium dopant species, including at least one of the forms of:
  (A) elemental selenium;
  (B) hydrogen selenide;
  (C) organoselenium compound;
  (D) selenium halide;
  (E) polyselenide; and
  (F) one or more of (A)-(E), isotopically enriched above natural abundance in at least one selenium isotope.

Such method may be carried out, in which the enhancing operation comprises enhanced operational character of said ion implantation system in at least one of recipe transition, beam stability, source life, beam uniformity, beam current, and cost of ownership, relative to corresponding operation of the ion implanter without any such co-flow gas. The method may be constituted in utilizing as at least one of the first and second gas storage and dispensing vessels a vessel containing a sorbent medium on which the selenium dopant species is adsorbed, and from which the selenium dopant species is desorbed under dispensing conditions. Alternatively, the method may be carried out, wherein at least one of the first and second gas storage and dispensing vessels comprises an internally pressure-regulated vessel comprising one or more pressure regulators in an interior volume of the vessel, or an ionic liquid storage and dispensing vessel.

A further aspect of the present disclosure relates to a feedstock supply package for ion implantation, comprising a storage and dispensing vessel holding a selenium dopant species selected from the group consisting of: (A) polyselenide; (B) elemental selenium isotopically enriched above natural abundance in at least one selenium isotope; (C) hydrogen selenide isotopically enriched above natural abundance in at least one selenium isotope; (D) organoselenium compound isotopically enriched above natural abundance in at least one selenium isotope; and (E) polyselenide isotopically enriched above natural abundance in at least one selenium isotope.

In the feedstock supply package, the storage and dispensing vessel may comprise at least one of (i) a sorbent medium on which the selenium dopant species is adsorbed, and from which the selenium dopant species is desorbed under dispensing conditions, (ii) an ionic liquid storage medium for the selenium dopant species, and (iii) one or more pressure regulators in an interior volume of the vessel, configured for pressure regulating dispensing of the selenium dopant species from the vessel.

The feedstock supply package may be provided, wherein the selenium dopant species and a co-flow gas are co-mixed in the storage and dispensing vessel.

Thus, in various specific embodiments, the present disclosure relates to a system and method for implanting a dopant species from a feedstock gas, e.g., a hydride feedstock gas, comprising a dopant species such as selenium, arsenic, germanium, tellurium, phosphorus, or the like, wherein the feedstock gas is flowed to the implanter with a co-flow gas that is effective to combat at least one of the ion source failure modes of (i) excessive sputtering of the cathode, resulting in so-called "punch-through" of the cathode, (ii) excessive deposition of solids and insulating surfaces, resulting in electrical shorts or "glitching," and (iii) solids buildup that causes shorting between two components of differing electric potential, and (iv) solids buildup on the cathode, e.g., solids buildup that causes loss of electron emission efficiency resulting in loss of ion beam current, and optionally wherein the dopant species is isotopically enriched above natural abundance in one or more isotopes thereof.

Considering each of the above-mentioned failure modes (i)-(iv), the co-flow gas can be selected to overcome such modes in combination with the feedstock gas.

For failure mode (i), excessive sputtering of the cathode, and susceptibility of the cathode to "punch-through" in which the cathode loses structural integrity as a result of the loss of cathode material, the cathode is typically formed of tungsten. Accordingly, the co-flow gas can be selected to enable tungsten transport to take place in the ionization chamber, so that the tungsten loss from the cathode sputter is counteracted by deposition of tungsten on the cathode. The co-flow gas for such purpose can be a fluorine-containing gas species, e.g., $XeF_2$, $NF_3$, $F_2$, etc., so that tungsten that is lost by sputtering of the cathode into the ambient environment in the ionization chamber of the implanter will react with the fluorine from the fluorine-containing co-flow gas, to form tungsten hexafluoride, $WF_6$, which will in turn will deposit tungsten on the cathode surface to combat tungsten volatilization and loss from the cathode.

An illustrative example of this approach is the co-flow to the implanter of a selenium feedstock gas, such as hydrogen selenide or elemental selenium gas, with the fluorine-containing co-flow gas, e.g., fluorine gas. The fluorine gas will help to deposit tungsten back on the cathode, thereby countering the sputtering effect of the cathode. Additionally, the fluorine co-flow gas will serve to keep selenium from depositing on the cathode, or clean any already present deposits of selenium on the cathode, by forming the volatile selenium hexafluoride by-product, which will be swept through the ionization chamber in the gas phase.

Such approach can also be employed for other hydride feedstock gases, e.g., arsine, phosphine, or germane. Further, in lieu of a fluorine-containing co-flow gas, the co-flow gas may comprise a chlorine-containing gas, or any other co-flow gas that when present in the ionization chamber of an implanter with the feedstock gas is effective to combat sputtering loss of the cathode, and preferably in addition is effective to form a volatile species with the dopant species to prevent it from depositing on the cathode or other surfaces in the ionization chamber or other implanter components.

The co-flow gas can be flowed to the ionization chamber of the implanter in mixture with the feedstock gas, or it can be flowed to the ionization chamber separately from the feedstock gas, such as in a separate flow line from the flow line in which the feedstock gas is delivered to the ionization chamber. For example, the co-flow gas and dopant gas can be packaged within the same cylinder/vessel, and flowed as a mixture to the ionization chamber. As another alternative, the co-flow gas and dopant gas can be packaged in two or more separate cylinders and flowed through respective flow controllers and then mixed prior to the ionization chamber. As a still further alternative, the co-flow gas and dopant gas can be flowed separately to the ionization chamber.

For failure modes (ii) and (iii), involving excessive deposition of solids and insulating surfaces, resulting in electrical shorts or "glitching," and/or solids buildup that causes shorting between two components of differing electric potential, the co-flow gas is selected to be a gas that will chemically etch deposited solids to produce volatile products, thereby effectively cleaning the deposits from the ionization chamber and other components of the implanter on which they are deposited. The co-flow gas for such purpose may comprise a fluorine-containing gas or other halogen-containing gas, and may be delivered in mixture with the feedstock gas, or contemporaneously in a separate flow line to the ionization chamber (ion source chamber) of the implanter.

For failure mode (iv), in which excessive cathode buildup occurs, potentially associated with high duty cycle processing of fluorinated dopant species, the hydride dopant species can be co-flowed, either separately or in mixture, with an inert gas, preferably a heavier inert gas such as argon, xenon, or krypton, and also operate at a relatively high arc voltage (e.g., 80+V) to improve sputtering effectiveness.

In a further aspect, the disclosure relates to ion implantation of selenium, in which a polyselenium compound is utilized for the implantation. The polyselenium compound is a gas phase molecular species of the formula $Se_n$, wherein n is from 2 to 8, in which the exact composition of the gas phase depends on the temperature. For example, at 400° C., $Se_7$, $Se_6$, and $Se_5$ constitute almost 90% of the gas phase, whereas at 800° C., $Se_e$ becomes the predominant single selenium species (~50% of the gas phase), and Se and $Se_5$ together compose ~30% of the gas phase.

The disclosure correspondingly contemplates temperature control of the polyselenium composition to provide a selenium cluster source gas of the desired constitution. Elemental selenium or hydrogen selenide or other selenide compound or complex can be used as a source reagent for forming the polyselenium compound or complex in the first instance. Hydrogen selenide thermally decomposes into hydrogen ($H_2$) and selenium (Se) at temperature above 400° C., which enables its use in conventional ion implantation tools in which the ion source is operated at temperatures that are close to 1000° C. A temperature is employed that is effective to form the selenium cluster source gas compound or complex of interest, for the ion extraction and implantation operation.

The thermal manipulation of the selenium, deriving from hydrogen selenide or other selenium source compound or complex, or from elemental selenium in the first instance, to form a desired selenium cluster source gas composition, enables significant advantages to be achieved in the implanter operation. These advantages include increases in effective ion beam current, and the ability to achieve shallow implantation of selenium.

Such cluster ion implantation of selenium is effectively carried out in various embodiments with the provision of co-flow of cleaning gas, such as the fluorine-containing gas previously described. The cleaning gas may be provided to the ion implanter in mixture with the selenium feedstock gas, or it may be contemporaneously flowed to the ionization chamber of the implanter, separately from the selenium feedstock gas.

In other embodiments, the cleaning gas is flowed to the ionization chamber of the implanter on a periodic basis, e.g., according to a cycle time schedule for cleaning operation.

Another aspect of the disclosure relates to ion implantation of selenium in which the selenium-containing feedstock gas is isotopically enriched above natural abundance in selected selenium isotopes.

In conventional ion implantation of selenium, in which hydrogen selenide is employed as the feedstock gas, the $H_2Se$ is flowed to the ion source where the $H_2Se$ molecules are ionized and fragmented to form $Se^+$ ions. $Se^+$ ion then is extracted from the source and passed through a mass analyzer that separates Se isotopes and allows selecting one or more that then are implanted in a substrate such as GaAs. Conventional practice is to select 80Se isotope for implantation because it constitutes 49.61% of the isotopic distribution of selenium.

The present disclosure encompasses the use of selenium-containing feedstock gases that are isotopically enriched above natural abundance for ion implantation in one or more isotopic species. The natural abundance of selenium is as follows:
74Se=0.89%
76Se=9.37%
77Se=7.63%
78Se=23.77%
80Se=49.61%
82Se=8.73%
wherein the percentages are atomic weight percentages.

The supra-abundance (i.e., above natural abundance) selenium-containing feedstock gas in accordance with the present disclosure may have any one or more of such isotopic species present in an amount that is greater than such natural abundance level(s), up to 100% in the case of a single isotopic species in the feedstock gas that is subjected to ionization in the implanter ionization chamber, with the atomic weight percentages being based on the total atomic weight of all selenium isotope species in the feedstock gas and totaling to 100 atomic weight percent for all isotopic selenium species in the feedstock gas.

By way of example, a feedstock gas enriched in 80Se may have a concentration in various embodiments that is in a range whose lower limit is any of 50%, 55%, 60%, 65%, 70%, 75%, 80%, 85%, 90%, 95%, 98%, 99%, 99.5% and whose upper limit is any of 55%, 60%, 65%, 70%, 75%, 80%, 85%, 90%, 95%, 98%, 99%, 99.5%, or 100%, including any permutations of such upper or lower atomic percentages, e.g., a range of from 55 to 80%, a range of from 70 to 95%, a range of from 60 to 100%. Embodiments are also contemplated in which the feedstock gas isotopically enriched in 80Se may contain such isotope in a concentration at any of the aforementioned upper/lower limit values in the feedstock gas that is introduced to the ionization chamber for ion implantation in a substrate.

The disclosure includes feedstock gas that is of a supra-abundance character with respect to two or more isotopic species, e.g., 77Se that is present at a concentration of 30%, together with 78Se that is present at a concentration of 70% in the feedstock gas.

In various embodiments, the disclosure contemplates supra-abundance selenium-containing feedstock gases in which any one or more of the aforementioned isotopes of selenium is present at any concentration in a range whose lower value is the next higher whole number exceeding its natural abundance (i.e., 74Se=1%, 76Se=10%, 77Se=8%, 78Se=24%, 80Se=50%, 82Se=9%) and up to 100 atomic percent in the case of single isotope feedstock gas, wherein when the feedstock gas comprises multiple selenium isotopes, the total of all atomic percentages of all selenium isotopes is 100 atomic percent.

Specific single isotope selenium feedstock gases may be advantageous in achieving various benefits in implanter operation, e.g., improving implanter tool productivity as a result of increased selenium beam current, reducing mean time between failures and/or reduction of preventative maintenance frequency, and avoiding cross-contamination problems in the operation of an implanter that is used to process different feedstock dopant species. For example, the use of 80Se may be of considerable value in reducing the incidence of cross-contamination when the implanter is used to implant both arsenic and selenium dopants in different runs in the implant system. As another example, the use of 82Se at high enrichment, e.g., from 15 to 100 atomic % of the feedstock gas selenium content, can be highly advantageous due to the thermal neutron cross section of 82Se being 1000 times lower than that of 76Se or 77Se, a significant benefit in the manufacture of microelectronic devices that are susceptible to so-called soft errors.

The same forms of dopant feedstock materials for selenium can be used, as for non-isotopically enriched materials, such as metallic selenium as a source material for the dopant, or hydrogen selenide, or organometallic selenium precursors (e.g., $R_2Se$ wherein each R is independently H or $C_1$-$C_{12}$ alkyl and at least one R is $C_1$-$C_{12}$ alkyl), in which the selenium instead of being of a natural abundance distribution of selenium isotopes, is enriched above natural abundance in one or more selenium isotopes. Although the disclosure herein is primarily directed to beam line modes of ion implantation, it will be recognized that the techniques and approaches described herein are amenable to application in other modes of ion implantation, such as plasma immersion ion implantation.

Substrates in which dopant species are implanted in the practice of the present disclosure can be of any suitable type and may for example comprise wafer substrates or precursor device structures of semiconductor articles, flat panel display articles, solar panel articles, LED articles, supercapacitors, etc.

Isotopically enriched dopant source gases can be provided to the ion implanter together with co-flow gases, which may be of any suitable type, and may for example include halides, hydrides, cleaning agents, etc.

Co-flow gases provided to the ion implanter in accordance with the present disclosure can in some embodiments include co-flow dopant source gases in which the same dopant species is present in the co-flow gas, and/or other dopant species, such as cluster molecules including multiple implant species. Alternatively, the ion implantation can be carried out with a feedstock gas accompanied by a co-flow gas, followed by the flow of a second co-flow gas to the implanter while the co-flow gas continues to be introduced to the ion implanter, so that the flow of co-flow gas is continuous and continues transitionally during the changeover from the first feedstock gas to the second feedstock gas, without cessation of operation of the implanter apparatus (the ion selection/extraction components of the apparatus can be appropriately "re-tuned" during the transition. By such arrangement, co-dopant species can be implanted in the substrate being ion implanted, in an operationally efficient manner.

In various embodiments, the co-dopant species comprises carbon, e.g., from a source material such as CO; $CO_2$; $CF_4$; $CH_4$; $COF_2$; $CH_2O$; $C_2F_4H_2$; $C_2H_6$; etc.

A wide variety of co-flow gases is contemplated in the broad practice of the present disclosure, in specific implementations thereof. For example, the co-flow gas or precursor therefor may comprise one or more materials selected from the group consisting of: $H_2$, $PH_3$, $AsH_3$, $CH_4$, $GeH_4$, $SiH_4$, $H_2Se$, $NH_3$, $F_2$, $XeF_2$, $BF_3$, $SF_6$, $GeF_4$, $SiF_4$, $SeF_4$, $SeF_6$, $NF_3$, $N_2F_4$, HF, $WF_6$, $MoF_6$, Ar, Ne, Kr, Xe, He, $N_2$, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, CO, $CO_2$, compounds of the formula $X_yF_z$ wherein X is any element in stoichiometric ratio with F, $y \geq 1$, and $z \geq 1$, noble gases, compounds of the formula $C_aO_xH_yF_z$ wherein $a \geq 0$, $x \geq 0$, $y \geq 0$ and $z \geq 1$, compounds of the formula $C_xF_yH_z$ wherein $x \geq 0$, $y \geq 0$, and $z \geq 0$, fluorine-containing gases, etc.

Illustrative co-flow hydride gases include $H_2$, $PH_3$, $AsH_3$, $CH_4$, $GeH_4$, $SiH_4$, and $NH_3$.

Illustrative co-flow fluoride gases useful with the feedstock gases of the disclosure include $F_2$, $XeF_2$, $BF_3$, $SF_6$, $GeF_4$, $SiF_4$, $SeF_4$, $SeF_6$, $NF_3$, HF, $WF_6$, and $MoF_6$.

Noble gases that may be employed as co-flow components include Ar, Ne, Kr, Xe, and He.

Oxide gas co-flow components include $O_2$, $O_3$, $H_2O_2$, and $H_2O$.

Other gases that may be employed as co-flow gases in the practice of the present disclosure include, without limitation, $Cl_2$, $F_2$, $N_2$, $XeF_2$, and HCl.

In specific embodiments, the feedstock gas may be provided to the ion implanter in mixture and/or co-flow relationship with one or more fluorocompound gas(es) selected from the group consisting of $F_2$, $COF_2$, $CF_4$, $MoF_6$, $B_2F_4$, $SeF_4$, $SeF_6$, $NF_3$, $N_2F_4$, $XeF_2$, $BF_3$, $SF_6$, $GeF_4$, $SiF_4$, $WF_6$, compounds of the formula $X_yF_z$ wherein X is any element in stoichiometric ratio with F, $y \geq 1$, and $z \geq 1$, and compounds of the formula $C_aO_xH_yF_z$ wherein $a \geq 0$, $x \geq 0$, $y \geq 0$ and $z \geq 1$, and compounds of the formula $C_xF_yH_z$ wherein $x \geq 0$, $y > 0$, and $z \geq 0$.

In a specific aspect, the disclosure contemplates hydrogen selenide gas mixtures or co-flow arrangements involving the following gases:

$H_2Se+H_2$
$H_2Se+H_2+XeF_2$
$H_2Se+CH_4$
$H_2Se+CO$
$H_2Se+COF_2$
$H_2Se+COF_2+O_2+H_2$
$H_2Se+SeF_4$
$H_2Se+SeF_6$
$H_2Se+NF_3$
$H_2Se+XeF_2$
$H_2Se+F_2$.

Dopant source gases as described herein can be packaged in any suitable form for supply to an ion implantation facility, and may for example be supplied in mixture with a co-flow gas or gases, or may be furnished in the form of packaged dopant source gas and separately packaged co-flow gas. The disclosure therefore contemplates an assembly comprising a packaged dopant source gas and a package co-flow gas, as supplied to an ion implantation facility for contemporaneous use thereof in such facility. The co-flow gas may be flowed to the ion implantation system in any suitable manner, e.g., concurrently with the dopant source gas during the entire period of the dopant source gas flow to the ion implanter, or alternatively during only part of the flow of the dopant source gas to the ion implanter, or alternatively intermittently during continuous flow of the dopant source gas to the ion implanter, or alternatively in any other manner in which the benefit of the co-flow gas may be realized.

The disclosure correspondingly contemplates a gas supply kit for an ion implantation system, comprising (i) a first gas storage and dispensing vessel holding the feedstock gas or a source reagent therefor, and (ii) a second gas storage and dispensing vessel holding a co-flow gas.

The disclosure further comtemplates a method of enhancing operation of an ion implantation system, comprising providing for use in the ion implantation system (i) a first gas storage and dispensing vessel holding the feedstock gas or a source reagent therefor, and (ii) a second gas storage and dispensing vessel holding a co-flow gas.

The provision of co-flow gas with the feedstock gas in the various embodiments of the present disclosure can be employed to enhance operational character of the ion implanter in at least one of recipe transition, beam stability, source life, beam uniformity, beam current, and cost of ownership, relative to corresponding operation of the ion implanter without any such co-flow gas.

Specific packages of dopant feedstocks and co-flow gases in various embodiments include storage and dispensing vessels of a type containing a sorbent medium on which the feedstock gas is physically adsorbed for storage of the gas, with the gas being desorbed from the sorbent medium, under dispensing conditions, for discharge from the vessel. The sorbent medium may be a solid-phase carbon adsorbent material. Sorbent-based vessels of such type are commercially available from ATMI, Inc. (Danbury, Conn., USA) under the trademarks SDS and SAGE. Alternatively, the vessel may be of an internally pressure-regulated type, containing one or more pressure regulators in the interior volume of the vessel. Such pressure-regulated vessels are commercially available from ATMI, Inc. (Danbury, Conn., USA) under the trademark VAC. As a still further alternative, the vessel may contain dopant source material in a solid form that is volatilized, e.g., by heating of the vessel and/or its contents, to generate the dopant gas as a vaporization or sublimation product. Solid delivery vessels of such type are commercially available from ATMI, Inc. (Danbury, Conn., USA) under the trademark ProEvap. Other gas storage and dispensing vessels are contemplated, containing ionic liquids as storage media for the gas or gases.

Referring now to the drawings, the FIGURE is a schematic representation of an ion implantation system illustrating modes of operation according to the present disclosure in which a feedstock gas is supplied to an ion implanter for implantation of a dopant species in a substrate.

As illustrated in the FIGURE, implantation system 10 includes an ion implanter 12 that is arranged in receiving relationship to gas supply packages 14, 16 and 18, for delivering feedstock gas and co-flow gas to the implanter.

Gas supply package 14 includes a vessel containing a selenium-containing feedstock gas such as hydrogen selenide. The vessel includes a valve head assembly 22 with a discharge port 24 joined to feedstock gas feed line 44. The valve head assembly 22 is equipped with a hand wheel 38, for manual adjustment of the valve in the valve head assembly, to translate same between fully open and fully closed positions, as desired, to effect dispensing or alternatively, closed storage, of the gas contained in vessel 20.

Co-flow gases are contained in co-flow gas supply packages 16 and 18, each constructed in similar manner to source 14. Co-flow supply package 16 comprises a vessel 26 equipped with a valve head assembly 28 to which is coupled a hand wheel 40. The valve head assembly 28 includes a discharge port 30 to which is joined a co-flow gas feed line 52.

Co-flow supply package 18 includes vessel 32 equipped with a valve head assembly 34 to which is coupled hand wheel 42 for actuation of the valve in the valve head assembly 34. The valve head assembly 34 also includes discharge port 36 joined to co-flow gas discharge line 60.

In the arrangement shown, the gases supplied in the various vessels can be varied from the arrangement described above. For example, a dopant source gas, or multiple dopant source gases may be supplied, or a dopant gas or gases, and non-dopant co-flow gas or gases, may be supplied, in any desired combinations. Thus, the illustrated arrangement permits three dopant source gases, or alternatively one dopant source gas and two co-flow gases, or alternatively two dopant source gases and one co-flow gas, to be selectively dispensed for flow to the mixing chamber 68.

For the purpose of controlling flow from the respective sources, the respective gas feed lines 44, 52 and 60 are provided with flow control valves 46, 54 and 62 therein, respectively.

Flow control valve 46 is equipped with an automatic valve actuator 48, having signal transmission line 50 connecting the actuator to CPU 78, whereby CPU 78 can transmit control signals in signal transmission line 50 to the valve actuator to modulate the position of the valve 46, to correspondingly control the flow of gas from vessel 20 to the mixing chamber 68.

In like manner, gas discharge line 52 contains flow control valve 54 coupled with valve actuator 56 that in turn is coupled by signal transmission line 58 to the CPU 78. Correspondingly, flow control valve 62 in gas discharge line 60 is equipped with valve actuator 64 coupled by signal transmission line 66 to the CPU 78.

In this manner, the CPU can operatively control the flow of the respective gases from the corresponding vessels 20, 26 and 32.

In the event that gases are concurrently flowed (co-flowed) to mixing chamber 68, the resulting gas is then discharged to feed line 70 for passage to the ion implanter 12.

Correspondingly, if only a single gas supply package 14, 16 or 18 is operated in dispensing mode at a given time, the corresponding single gas then flows through the mixing chamber, as modulated by the associated flow control valve, and is passed in feed line 70 to the ion implanter.

Feed line 70 is coupled with a bypass flow loop comprised of bypass lines 72 and 76 communicating with the feed line, and with gas analyzer 74. The gas analyzer 74 thus receives a side stream from the main flow in feed line 70, and responsively generates a monitoring signal correlative of the concentration, flow rate, etc. of the gas stream and transmits a monitoring signal in the signal transmission line coupling the analyzer 74 with CPU 78. In such manner, the CPU 78 receives the monitoring signal from gas analyzer 74, processes same and responsively generates output control signals that are sent to the respective valve actuators 48, 56 and 64, or selected one or ones thereof, as appropriate, to effect the desired dispensing operation of gas to the ion implanter.

The ion implanter 12 produces an effluent that is flowed in effluent line 80 to effluent treatment unit 82, which may treat the effluent by effluent treatment operations including scrubbing, catalytic oxidation, etc., to generate a treated gas effluent that is discharged from the treatment unit 82 in vent line 84, and may be passed to further treatment or other disposition.

The CPU 78 may be of any suitable type, and may variously comprise a general purpose programmable computer, a special purpose programmable computer, a programmable logic controller, microprocessor, or other computational unit that is effective for signal processing of the monitoring signal and generation of an output control signal or signals, as above described.

The CPU thus may be programmatically configured to effect a cyclic operation including concurrent flow of gases from two or all three of the gas supply packages 14, 16 and 18, with the respective gases being flowed in sequence. Thus, any flow mode involving co-flow or mixture of gases, or sequential gas flows, may be accommodated.

While the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A method for implanting selenium, said method comprising
flowing a feedstock gas to an implanter with a co-flow gas that is effective to combat at least one of the ion source failure modes of (i) sputtering of a cathode, (ii) deposition of solids on insulating surfaces, and (iii) solids buildup that causes shorting between two components of differing electric potential, and (iv) solids buildup on the cathode, wherein the feedstock gas comprises an organoselenium compound that is isotopically enriched above natural abundance in at least one selenium isotope, said organoselenium compound is of the formula R'SeR" wherein each R can comprise hydrogen, halide, alkyl, alkoxy, or nitrogen-containing functionality and wherein the organoselenium compound isotopically enriched above natural abundance of at least one selenium isotope of $^{74}$Se, $^{76}$Se, $^{77}$Se, $^{78}$Se, $^{80}$Se, and $^{82}$Se.

2. The method of claim 1, wherein the feedstock gas is flowed to the implanter in mixture with the co-flow gas, or the feedstock gas and the co-flow gas are flowed to the implanter in separate gas flow conduits.

3. The method of claim 1, wherein the co-flow gas comprises at least one gas species selected from the group consisting of $H_2$, $PH_3$, $AsH_3$, $CH_4$, $GeH_4$, $SiH_4$, $H_2Se$, $NH_3$, $F_2$, $XeF_2$, $BF_3$, $SF_6$, $GeF_4$, $SiF_4$, $SeF_4$, $SeF_6$, $NF_3$, $N_2F_4$, HF, $WF_6$, $MoF_6$, Ar, Ne, Kr, Xe, He, Na, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, CO, $CO_2$, compounds of the formula $X_yF_z$ wherein X is any element in stoichiometric ratio with F, y≥1, and z≥1, noble gases, gaseous compounds of the formula $C_aO_xH_yF_z$ wherein a≥0, x≥0, y≥0 and z≥1, gaseous compounds of the formula $C_xF_yH_z$ wherein x≥0, y≥0, and z≥0, and fluorine-containing gases.

4. The method of claim 1, wherein the feedstock gas and co-flow gas comprise a gas combination that is isotopically enriched above natural abundance in at least one selenium isotope, said gas combination selected from the group consisting of:
$H_2Se+CH_4$
$H_2Se+CO$
$H_2Se+COF_2$
$H_2Se+COF_2+O_2+H_2$
$H_2Se+SeF_4$
$H_2Se+SeF_6$
$H_2Se+NF_3$
$H_2Se+F_2$.

5. A feedstock gas composition comprising an organoselenium compound and a co-flow gas, the organoselenium compounds has the formula R'SeR", wherein each of R' and R" independently can comprise hydrogen, halide, alkyl, alkoxy, or nitrogen-containing functionality and wherein the organoselenium compound isotopically enriched above natural abundance of at least one selenium isotope of $^{74}Se$, $^{76}Se$, $^{77}Se$, $^{78}Se$, $^{80}Se$, and $^{82}Se$.

6. The feedstock gas composition of claim 5 wherein each R is independently H or $C_1$-$C_{12}$ alkyl and at least one R is $C_1$-$C_{12}$ alkyl.

7. The feedstock gas composition of claim 5, wherein the organoselenium dopant species and a co-flow gas are co-mixed in the storage and dispensing vessel.

8. The feedstock gas composition of claim 5, wherein the co-flow gas comprises at least one gas species selected from the group consisting of $H_2$, $PH_3$, $AsH_3$, $CH_4$, $GeH_4$, $SiH_4$, $H_2Se$, $NH_3$, $F_2$, $XeF_2$, $BF_3$, $SF_6$, $GeF_4$, $SiF_4$, $SeF_4$, $SeF_6$, $NF_3$, $N_2F_4$, HF, $WF_6$, $MoF_6$, Ar, Ne, Kr, Xe, He, Na, $O_2$, $O_3$, $H_2O_2$, $H_2O$, $Cl_2$, HCl, $COF_2$, $CH_2O$, $C_2F_4H_2$, $PF_3$, $PF_5$, $CF_4$, $CF_3H$, $CF_2H_2$, $CFH_3$, $B_2F_4$, CO, $CO_2$, compounds of the formula $X_yF_z$ wherein X is any element in stoichiometric ratio with F, y≥1, and z≥1, noble gases, gaseous compounds of the formula $C_aO_xH_yF_z$ wherein a≥0, x≥0, y≥0 and z≥1, gaseous compounds of the formula $C_xF_yH_z$ wherein x≥0, y≥0, and z≥0, and fluorine-containing gases.

* * * * *